United States Patent
Findeklee et al.

(10) Patent No.: US 10,060,994 B2
(45) Date of Patent: Aug. 28, 2018

(54) Z-SEGMENTED RADIO FREQUENCY ANTENNA DEVICE FOR MAGNETIC RESONANCE IMAGING

(71) Applicant: KONINKLIJKE PHILIPS N.V., Eindhoven (NL)

(72) Inventors: Christian Findeklee, Eindhoven (NL); Christoph Leussler, Eindhoven (NL)

(73) Assignee: KONINKLIJKE PHILIPS N.V., Eindhoven (NL)

( * ) Notice: Subject to any disclaimer, the term of this patent is extended or adjusted under 35 U.S.C. 154(b) by 607 days.

(21) Appl. No.: 14/439,137

(22) PCT Filed: Oct. 23, 2013

(86) PCT No.: PCT/IB2013/059567
§ 371 (c)(1),
(2) Date: Apr. 28, 2015

(87) PCT Pub. No.: WO2014/068447
PCT Pub. Date: May 8, 2014

(65) Prior Publication Data
US 2015/0276898 A1    Oct. 1, 2015

Related U.S. Application Data

(60) Provisional application No. 61/721,294, filed on Nov. 1, 2012.

(51) Int. Cl.
*G01V 3/18* (2006.01)
*G06F 3/041* (2006.01)
(Continued)

(52) U.S. Cl.
CPC ... *G01R 33/34076* (2013.01); *G01R 33/3415* (2013.01); *G01R 33/34046* (2013.01);
(Continued)

(58) Field of Classification Search
CPC ........ G01R 33/34076; G01R 33/34092; G01R 33/5659; G01R 33/5612; G01R 33/3415; G01R 33/34046
(Continued)

(56) References Cited

U.S. PATENT DOCUMENTS 7,345,481 B2   3/2008  Leussler
8,035,384 B2  10/2011  Saha
(Continued)

FOREIGN PATENT DOCUMENTS

EP    2015094 A1   1/2009
JP   05031092 A   2/1993

OTHER PUBLICATIONS

Vernickel, P. et al "An Eight Channel Transmit/Receive Body Coil for 3T", Proceedings of the International Society for Magnetic Resonance in Medicine, vol. 14, 2006, pp. 123.
(Continued)

*Primary Examiner* — Farhana Hoque

(57) ABSTRACT

A radio frequency (RF) antenna device (140) applies an RF field to an examination space (116) of a magnetic resonance (MR) imaging system (110). The RF antenna device (140) has a tubular body and is segmented in its longitudinal direction (154). Each segment (162, 164) has at least one activation port. The result is that each mode, corresponding to an activation port, may be controlled individually. Accordingly, the inhomogeneity of the subject of interest in the longitudinal direction of the RF antenna device can directly be addressed. There are different ways to build up a z-segmented RF antenna device.

17 Claims, 4 Drawing Sheets

(51) Int. Cl.
G01R 33/34 (2006.01)
G01R 33/3415 (2006.01)
G01R 33/345 (2006.01)
G01R 33/561 (2006.01)
G01R 33/565 (2006.01)

(52) U.S. Cl.
CPC ... *G01R 33/3453* (2013.01); *G01R 33/34092* (2013.01); *G01R 33/5612* (2013.01); *G01R 33/5659* (2013.01)

(58) Field of Classification Search
USPC .................................................. 324/309, 318
See application file for complete search history.

(56) References Cited

U.S. PATENT DOCUMENTS

| | | | |
|---|---|---|---|
| 2004/0155656 A1* | 8/2004 | Leussler | G01R 33/34046 324/318 |
| 2007/0279058 A1 | 12/2007 | Bulkes et al. | |
| 2008/0157770 A1 | 7/2008 | Peshkovsky | |
| 2009/0099444 A1 | 4/2009 | Bogdanov | |
| 2010/0141259 A1 | 6/2010 | Graesslin | |
| 2010/0228249 A1* | 9/2010 | Mohr | A61B 1/00009 606/41 |
| 2010/0253347 A1 | 10/2010 | Habara | |

OTHER PUBLICATIONS

Graesslin, I. et al "Fully Integrated Whole Body 3T MRI System for Parallel RF Transmission", Proceedings of the International Society for Magnetic Resonance in Medicine, vol. 15, 2007, pp. 1007.
Vernickel, P. et al "An Eight-Channel 3D-Segmented RF Coil for Parallel Transmission at 3T", Proceedings of the International Society for Magnetic Resonance in Medicine, vol. 15, 2007, pp. 167.
Ritter, J. et al "Multi-Banded T2-Weighted MRI with a Z-Encoding RF Coil Array for Whole Brain Coverage at 7T", Proceedings of the International Society for Magnetic Resonance in Medicine, vol. 19, 2011, pp. 3590.
Adriany, G. et al "A 32 Channel Transmit/Receive Trasnmission Line Head Array for 3D RF Shimming", Proceedings of the International Society for Magnetic Resonance in Medicine, vol. 15, 2007, pp. 166.
Avdievich, N.I. et al "High-Field Double-Tuned TEM/Birdcage Hybrid vol. Coil for Human Brain Imaging" Proceedings of the International Society for Magnetic Resonance in Medicine, vol. 15, 2007, pp. 239.
Gotshal, Uli et al "Isolation of Birdcage Coils using Mutual Capacitors on a Common End-Ring", Proceedings of the International Society for Magnetic Resonance in Medicine, vol. 10, 2002.
Boskamp, E.B. et al "Fast Drop off Cylindrical RF Transmit Coils", Proceedings of the International Society for Magnetic Resonance in Medicine, vol. 10, 2002.

* cited by examiner

Z-SEGMENTED RADIO FREQUENCY ANTENNA DEVICE FOR MAGNETIC RESONANCE IMAGING

CROSS-REFERENCE TO PRIOR APPLICATIONS

This application is the U.S. National Phase application under 35 U.S.C. § 371 of International Application No. PCT/IB2013/059567, filed on Oct. 23, 2013, which claims the benefit of U.S. Provisional Patent Application No. 61/721,294, filed on Nov. 1, 2012. These applications are hereby incorporated by reference herein.

FIELD OF THE INVENTION

The invention pertains to a radio frequency (RF) antenna device for applying an RF field to an examination space of a magnetic resonance (MR) imaging system, an MR imaging system employing at least one such RF antenna device, and a method for applying a radio frequency field to an examination space of a magnetic resonance imaging system.

BACKGROUND OF THE INVENTION

In the field of magnetic resonance (MR) imaging, it is known to especially use two types of radio frequency (RF) coils or antenna devices for exciting nuclear spins within a subject of interest, usually a patient, and detecting signals from them. Birdcage coils and transverse electromagnetic (TEM) coils are widely used for MR imaging in the very-high RF band (VHF) and have been introduced in commercial 3 T MR imaging scanners. The birdcage coil has multiple conductor rungs which are arranged around an examination region of the MR imaging scanner, extending parallel to a main magnetic field direction and connected to annular antenna rings. The TEM coil comprises multiple TEM coil elements, each having an elongate strip sections, wherein the plurality of TEM coil elements are arranged such that the elongate strip sections are substantially parallel and spaced apart in and/or around a space or volume for transmitting to or receiving from a subject to be examined. The strip sections are at their longitudinal ends electrically coupled to a conductive shielding of the RF antenna device. These coils require individual RF power supply to provide acceptable clinical image quality due to individual dielectric loading by the subject of interest.

The RF antenna device is usually provided with a fixed 90° excitation at the same amplitude which is provided by a hybrid coupler. Such coils have two feeding ports and are also referred to as quadrature coils, since they enable the generation of two orthogonal magnetic fields. Quadrature coils provide an increased signal to noise ratio of the RF antenna device. Other RF antenna devices even offer complete freedom of amplitude and phase for RF-shimming with a two-channel coil, which uses two geometrically decoupled feeding positions. This technique improves field homogeneity and enables imaging for different applications at high magnetic fields.

U.S. Pat. No. 7,345,481 B2 discloses an RF coil for an MR imaging system. The RF coil includes a birdcage section having a plurality of parallel spaced apart conductors and one or more cross or end conductors aligned generally transverse to the spaced apart conductors, and a TEM section having a plurality of parallel spaced apart conductors and a radio frequency screen. The birdcage section and the TEM section are relatively disposed with the parallel spaced apart conductors of each section aligned and define a subject receiving region.

However, there are still some subjects of interest in which the homogeneity could be improved. Also some special applications like imaging of the legs of a person typically demand at least four channels, as could be shown with multiple-channel research systems for MR imaging (MRI).

Such multiple-channel research systems are not yet available for the market, because they are expensive and complicated, since the production and the decoupling of the coils is very complicated. Due to residual coupling and patient dependent reflection, the known multiple-channel coils often need circulators to isolate power amplifiers for the different channels. Since circulators need a very defined magnetic field, it is difficult to place the power amplifiers near the coil or even at the coil. This design of the multiple-channel research systems is also different from the design of commercially available MRI-systems.

SUMMARY OF THE INVENTION

It is therefore an object of the present invention to provide a radio frequency (RF) antenna device, a magnetic resonance (MR) imaging system comprising such an RF antenna device, a method for applying an RF field to an examination space of an MR imaging system, and a software package for upgrading an MR imaging system, which enables the excitation of a homogeneous RF field to an examination space of an MR imaging system without an occurrence of excessive RF currents, with improved SAR control, and with improved RF shimming options.

In one aspect of the present invention, the object is achieved by a radio frequency (RF) antenna device for applying an RF field to an examination space of a magnetic resonance (MR) imaging system, whereby the RF antenna device is provided having a tubular body, the RF antenna device is segmented in its longitudinal direction, and each segment is provided with at least one activation port.

Accordingly, each segment of the RF antenna device, also referred to as coil, can be controlled individually, so that the inhomogeneity of the $B_1$-field inside the subject of interest in this direction, i.e. in the longitudinal direction of the RF antenna device, can directly be addressed. In particular, the activation ports of each segment may be controlled individually. The longitudinal direction is commonly referred to as z-direction or z-axis for tubular structures including RF antenna devices.

With the RF antenna device described above, the number of channels can be increased compared to an RF antenna device known in the art, since each segment has at least one individual activation port. The port or ports can be positioned in different ways depending on the type of coil and particular requirements, e.g. at end faces of the RF antenna device or at its outer circumference. Nevertheless, the RF antenna device can be provided having a small size. Each activation port may be realized by a galvanic connection or an inductive feeding.

The tubular body can have any suitable cross-section, including a circular, elliptic, or rectangular cross-section, or any suitable combination thereof. Preferably, the RF antenna device has a circular cross section, i.e. the RF antenna device has a cylindrical shape. Further preferred, each segment has the same size.

There are different ways to build up a z-segmented RF antenna device. Single elements can be made of TEM-resonators and/or birdcage resonators. Further details regarding preferred embodiments of the RF antenna device are given below. The antenna device can be implemented having two or more segments in the longitudinal direction. One or more of these elements can be made of degenerated elements.

With the RF antenna device having independent segments, a decoupling of the segments is achieved. This enables a simple control of the RF antenna device. E.g. a single amplifier together with a power splitter can be used without circulators to feed the inventive RF antenna device at two or four ports. Accordingly, an upgrade from a MRI device with a conventional coil, either a simple or a quadrature system, with an RF antenna device according to the present invention can be realized by replacing the RF antenna device and adding a power splitter and additional amplifiers as required. The control unit of the MRI system is modified to perform a respective control of the RF antenna device. Depending on the number of amplifiers and TR-switches for each segment, the control unit additionally controls each of the amplifiers, the TR-switches and the preamplifiers. Preferably, one power amplifier and preamplifier is provided and controlled for each segment, so that two activation ports have a feeding with fixed amplitude and a phase. Alternatively, independent amplifiers can be used for each activation port of each segment of the RF antenna device. Accordingly, also the antenna device can be operated like a common antenna device using power splitters to excite it by one or two amplifiers, so that only one kind of antenna devices can be used for MRI-systems, and an upgrade to two or four channels can be easily be performed.

Preferably, the RF antenna device is provided to apply the RF field to the examination space for resonant excitation at a first time of operation, and is further provided for receiving magnetic resonance RF energy emitted by the nuclei within the subject of interest at another time of operation that is different from the first time of operation. In other words, the RF antenna device may be provided to function as an RF transmit antenna as well as an RF receive antenna. This may allow for a compact design and also for avoiding cross-coupling between the RF transmit antenna and the RF receive antenna. Another function of the RF antenna device is to generate a homogeneous receive sensitivity for calibrating local receive coils, which enables an accelerated reception of signals. The RF antenna device can also be used within low magnetic fields of the main magnet. Furthermore, the RF antenna device can be used for different geometries, e.g. as a body coil or a head coil. The RF antenna device can also be designed to operate at two or more frequencies by making it multi-resonant. This is much more complicated in case of using other ways of decoupling.

According to a preferred embodiment the RF antenna device comprises a first and a second antenna ring, which are spaced apart on a common rotational axis, defining a top and bottom of the tubular body, a shielding element provided at an outer circumference of the RF antenna device, and a first and second set of antenna rungs, which are both arranged in parallel to the longitudinal direction of the RF antenna device at an inner side of the shielding element, whereby the first set of the rungs is at one of their ends each electrically coupled to the first antenna ring, thereby defining a first segment, and the second set of the rungs is at one of their ends each electrically coupled to the second antenna ring, thereby defining a second segment, and the rungs of both segments are at their free ends, which are not coupled to any of the antenna rings, each electrically coupled to the shielding element via a coupling element. This RF antenna device provides a combination of TEM-resonator and birdcage coil, which is referred to as a hybrid design in this application. Each segment of the RF antenna device behaves like transverse electromagnetic (TEM) coil in the center region of the RF antenna device and like a birdcage coil at the longitudinal end thereof. The profile of the magnetic field is similar to that of a conventional body coil if all amplitudes are chosen to be identical and the phases correspond to the geometric location of the activation ports. A decoupling of the segments of the RF antenna device is easily achieved, since the decoupling is solved by the geometry RF antenna device. Accordingly, adjustment of the RF antenna device is not required. The shielding element is provided having a tubular structure, preferably a cylindrical structure. It is conductive at the operating frequency, but usually not at the frequency of the gradient field. The shielding element can extend in the longitudinal direction over the antenna rings. The number of rungs can be chosen depending on the design and size of the RF antenna device. Preferably, the number of rungs is a multiple of four to get symmetric feeding options in 90° geometrical distance. The coupling element can be a conductor or any other suitable kind of coupling element. The coupling element preferably comprises a capacitor, an inductor or a combination thereof. The rungs are made of a conductive material and can be segmented. Optionally, capacitors, inductors or any combination thereof, are provided between the segments of the rungs. Further preferred, the rungs can comprise a laminate structure with two or more conductive layers for generating capacitors.

Preferably, the antenna rings have a structure comprising multiple ring sections, which together form the antenna rings. Further preferred, the ring sections of each antenna ring may be provided with a gap between each other. Even further preferred, each ring section is connected to at least one rung. Further preferred, the antenna ring can comprise a laminate structure with two or more conductive layers for generating capacitors.

Additional capacitors can be placed in the rungs, providing a low-pass design, or in the antenna rings, providing a high-pass design, or both (band-pass design). Also the coupling element can have additional capacitors.

According to a preferred embodiment of the RF antenna device, the rungs connected to the opposite antenna rings are circumferentially displaced with a regular distance between adjacent rungs. The distance between the rungs depends on the dimensions of the RF antenna device and the number of rungs. The regular spacing facilitates the generation of a homogenous magnetic field.

According to a preferred embodiment the RF antenna device the first and the second set of rungs comprise the same number of rungs, and the rungs of the first and the second set are alternately arranged in a circumferential direction. Therefore, each segment has an identical design, which facilitates the generation of a homogenous magnetic field.

According to a preferred embodiment of the RF antenna device, the segments are provided with a length longer than half the length of the RF antenna device, so that the rungs of both segments overlap in a center area of the RF antenna device. The length refers to the extension in the longitudinal direction of the RF antenna device, i.e. the z-direction. The overlap in the center area, which refers to the area of the TEM resonators, provides a good geometric decoupling of the two segments. Due to the overlap, the distance between adjacent coupling elements is increased and the decoupling is improved. When driven in a standard mode, this RF antenna device behaves nearly the same as a traditional birdcage coil.

According to a preferred embodiment the RF antenna device the overlap is about 6.4 cm for an RF antenna device having typical dimensions. Typical dimensions of a quadrature birdcage coil (QBC) are shielding diameter 68 cm, coil diameter 60 cm, and coil length 50 cm. For other dimensions and/or designs of the RF antenna device, the overlap can have different values. The ideal overlap can be evaluated by 3D-field simulations for each particular design of a RF antenna device. Alternatively, the RF antenna device can be provided with an adjustable overlap, so that the overlap can be optimized by measurement of the coupling between the activation ports of the RF antenna device.

According to a preferred embodiment of the RF antenna device, the rungs of the two segments are at their free ends electrically coupled to each other in pairs. Accordingly, the rungs of the two segments extend in pairs in a common longitudinal axis. The coupling can be realized by electrically connecting the rungs. The pair of rungs can be commonly coupled to the shielding element with one coupling element for each pair of rungs. Also the RF antenna device of this embodiment is a hybrid RF antenna device.

According to a preferred embodiment of the RF antenna device, at least one intermediate set of rungs is provided, which is arranged in parallel to the longitudinal direction of the RF antenna device at an inner side of the shielding element, thereby defining at least one an intermediate segment located between the first and second segment, whereby the rungs of adjacent segments are at their adjacent ends electrically coupled to each other in pairs, and the rungs of adjacent segments are at their adjacent ends electrically coupled to the shielding element via a coupling element. This enables a birdcage structure with multiple segments in the longitudinal direction.

According to a preferred embodiment of the RF antenna device, the RF antenna device is provided as a transverse-electromagnetic (TEM) coil with a shielding element provided at an outer circumference of the RF antenna device, the RF antenna device comprises strip sections arranged in parallel to the longitudinal direction of the RF antenna device at an inner side of the shielding element, whereby the strip sections are coupled at their longitudinal ends to the shielding element, and each strip section is electrically coupled with at least one coupling element as described above to the shielding element. This alternative coil design provides another approach for segmentation of the RF antenna device. The coupling element usually comprises a conductor with a capacitor. The capacitor is provided with a well-defined capacity for decoupling. Preferably, in case of one coupling element separating the RF antenna device into two segments, the coupling element is located in the center of the strip section. In case of more than two coupling elements separating the RF antenna device into more than two segments, the coupling elements can be equally spaced apart along the strip section. The coupling at the longitudinal ends of the strip section can be realized using a conductor element. Optionally, the conductor element comprises at least one reactance, which is typically a capacitor.

According to a preferred embodiment of the RF antenna device, the RF antenna device is segmented in its longitudinal direction into two segments. In general, also RF antenna devices with higher numbers of segments in the longitudinal direction are possible. E.g. for the TEM coil, segmentation can easily be done by adding additional coupling elements. Nevertheless, the complexity of the RF antenna device and required electric and electronic components for operating the segments increases, so that a number of two segments has proven as an efficient approach.

According to a preferred embodiment of the RF antenna device, each segment of the RF antenna device is provided with two activation ports. Accordingly, each segment can be operated with two channels, i.e. each segment provides the features of a common quadrature coil. With e.g. a number of two segments of the RF antenna device, a total number of four channels can be realized, so that efficiency and homogeneity of the RF antenna device can be improved.

According to a further preferred embodiment of the RF antenna device, each segment of the RF antenna device is provided with more than two activation ports. Accordingly, each segment can be operated with more than two channels e.g. when the coil is degenerated. The activation ports can be provided at different parts of the RF antenna device, depending on the type and design of the RF antenna device. Accordingly, the activation ports can be provided at different elements of the antenna rings, the rungs, combinations thereof, or the strip sections.

In another aspect of the present invention, the object is achieved by a magnetic resonance (MR) imaging system, comprising a main magnet for generating a static magnetic field, a magnetic gradient coil system for generating gradient magnetic fields superimposed to the static magnetic field, an examination space provided to position a subject of interest within, at least one radio frequency (RF) antenna device as specified above, that is provided for applying an RF field to the examination space to excite nuclei of the subject of interest, and a control unit for controlling the at least one RF antenna device, whereby the control unit is individually connected to each segment of the RF antenna device. The connection is typically made via an RF-amplifier. The MR imaging (MRI) system uses the antenna device as described above to achieve the advantages of a segmented coil. Preferably, the control unit is individually connected to different elements of each segment, i.e. the antenna rings, the rungs, combinations thereof, or the strip sections.

In a further aspect of the present invention, the object is achieved by a method for applying a radio frequency (RF) field to an examination space of a magnetic resonance (MR) imaging system, comprising the steps of providing at least one radio frequency antenna device as specified above, individually controlling each activation port in each segment of the RF antenna device to generate a magnetic field, and commonly controlling the activation ports in each segment of the RF antenna device to provide a homogenous $B_1$ field within the examination space. The individual segments enable shimming also in the longitudinal direction of the RF antenna device, so that the generation of the magnetic field can be modified to provide a homogeneous magnetic field independent from the subject of interest. Preferably, the step of individually controlling each segment comprises control of different activation ports of the segment. Alternatively, groups of activation ports can be commonly controlled.

According to a preferred embodiment of the method, the step of individually controlling each activation port in each segment of the RF antenna device to generate a magnetic field comprises adjusting weights of the activation ports of each segment, and the step of commonly controlling the activation ports in each segment of the RF antenna device to provide a homogenous $B_1$ field comprises adjusting the activation according to the weights. The weight is typically a complex number, i.e. amplitude and phase are adjusted. By modifying the weights, the generation of a homogenous magnetic field can be performed without the need for individual activation of each segment. Preferably, also the overall power fed to the RF antenna device is controlled. Shimming can be performed by merely adjusting the weights. Preferably, also the RF power of the entire RF antenna device is adjusted. The weights can be adjusted dynamically during operation or statically in a setup step.

In a further aspect of the present invention, the object is achieved by a software package for upgrading a magnetic resonance (MR) imaging system, whereby the software package contains instructions for controlling the MR imaging system according to the method described above. In particular, the instructions of the software package are executed in a control unit of the MR imaging system. In some cases it may be required to perform additional modifications to the MRI system like modifying the amplifier and providing additional cables.

BRIEF DESCRIPTION OF THE DRAWINGS

These and other aspects of the invention will be apparent from and elucidated with reference to the embodiments described hereinafter. Such an embodiment does not necessarily represent the full scope of the invention, however, and reference is made therefore to the claims and herein for interpreting the scope of the invention.

In the drawings.

DETAILED DESCRIPTION OF EMBODIMENTS

Figure 1:
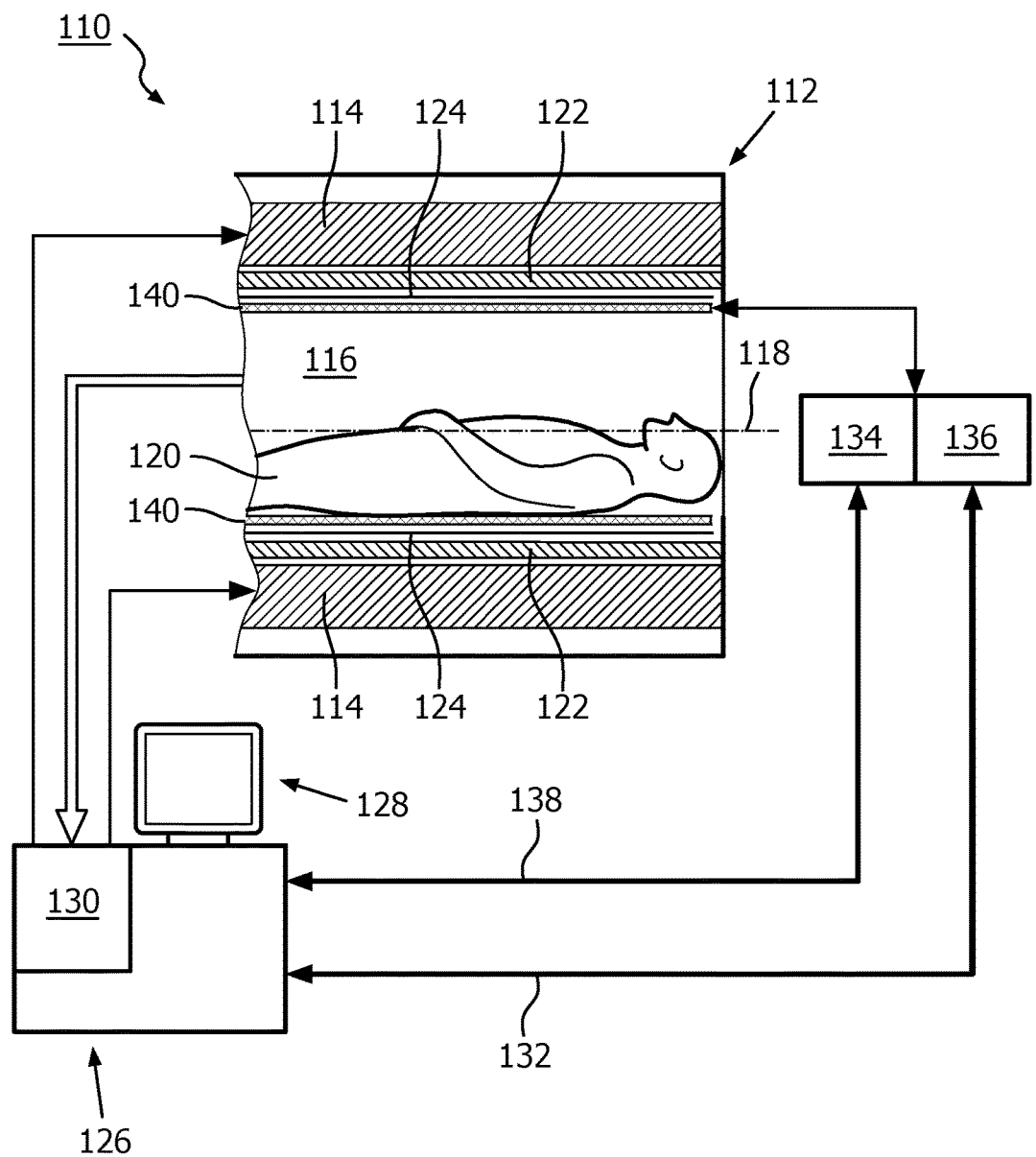
FIG. 1 is a schematic illustration of a part of an embodiment of a magnetic resonance (MR) imaging system including a radio frequency (RF) antenna device in accordance with the invention.

FIG. 1 shows a schematic illustration of a part of an embodiment of a magnetic resonance (MR) imaging system 110 comprising an MR scanner 112. The MR imaging system 110 includes a main magnet 114 provided for generating a static magnetic field. The main magnet 114 has a central bore that provides an examination space 116 around a center axis 118 for a subject of interest 120, usually a patient, to be positioned within. In an alternative embodiment a different type of MR imaging system providing an examination region within a static magnetic field is used. Further, the MR imaging system 110 comprises a magnetic gradient coil system 122 provided for generating gradient magnetic fields superimposed to the static magnetic field. The magnetic gradient coil system 122 is concentrically arranged within the bore of the main magnet 114, as known in the art.

Further, the MR imaging system 110 includes a radio frequency (RF) antenna device 140 designed as a whole-body coil having a tubular body. The RF antenna device 140 is provided for applying an RF magnetic field to the examination space 116 during RF transmit phases to excite nuclei of the subject of interest 120. The RF antenna device 140 is also provided to receive MR signal from the excited nuclei during RF receive phases. In a state of operation of the MR imaging system 110, RF transmit phases and RF receive phases are taking place in a consecutive manner. The RF antenna device 140 is arranged concentrically within the bore of the main magnet 114. As is known in the art, a cylindrical metal RF screen 124 is arranged concentrically between the magnetic gradient coil system 122 and the RF antenna device 140.

Moreover, the MR imaging system 110 comprises an MR image reconstruction unit 130 provided for reconstructing MR images from the acquired MR signals and an MR imaging system control unit 126 with a monitor unit 128 provided to control functions of the MR scanner 112, as is commonly known in the art. Control lines 132 are installed between the MR imaging system control unit 126 and an RF transmitter unit 134 that is provided to feed RF power of an MR radio frequency to the RF antenna device 140 via an RF switching unit 136 during the RF transmit phases. The RF switching unit 136 in turn is also controlled by the MR imaging system control unit 126, and another control line 138 is installed between the MR imaging system control unit 126 and the RF switching unit 136 to serve that purpose. During RF receive phase, the RF switching unit 136 directs the MR signals from the RF antenna device 140 to the MR image reconstruction unit 130 after pre-amplification.

Figure 2:
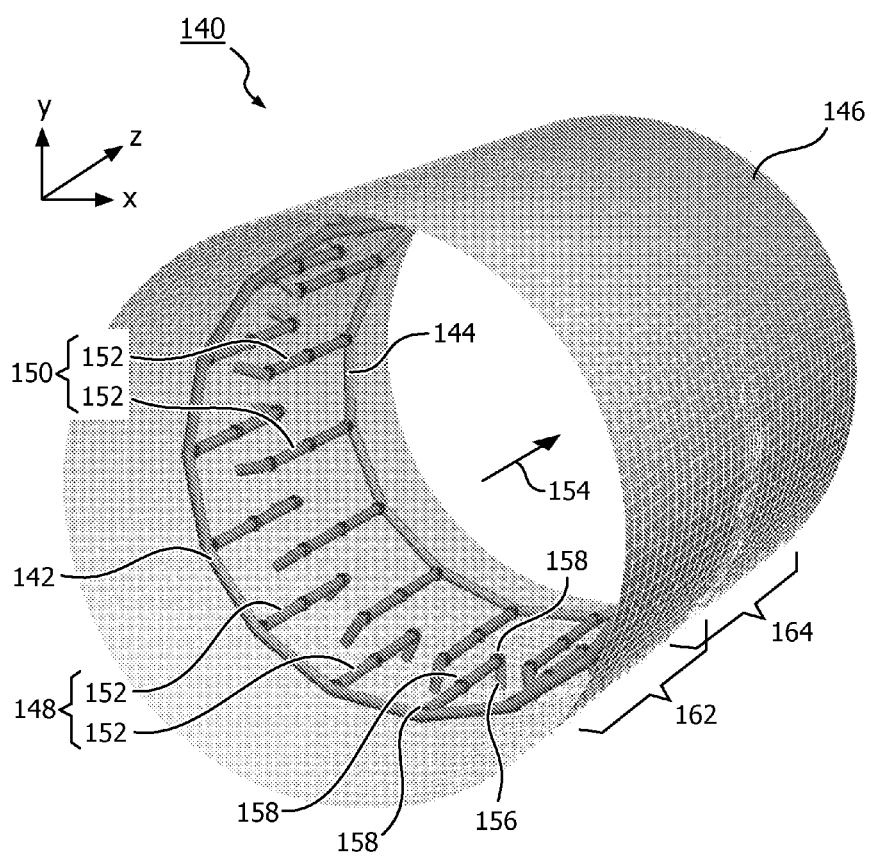
FIG. 2 is a perspective view of an RF antenna device according to a first embodiment.

FIG. 2 shows an RF antenna device 140 of the MR imaging system 110 according to a first embodiment. The RF antenna device 140 comprises a first and a second antenna ring 142, 144, which are spaced apart on a common rotational axis, defining a top and bottom of a tubular body of the RF antenna device 140. The antenna rings 142, 144 in this embodiment are provided as conductive loops. The distance between the antenna rings 142, 144 defines the length of the RF antenna device 140. A shielding element 146 is provided at an outer circumference of the RF antenna device 140 and extending beyond the antenna rings 142, 144 in the longitudinal direction of the RF antenna device 140. The shielding element 146 in this embodiment is conductive at the operating frequency, but not at the frequency of the gradient field generated by the magnetic gradient coil system 122.

A first and second set 148, 150 of rungs 152 are both arranged in parallel to the longitudinal direction 154 of the RF antenna device 140 at an inner side of the shielding element 146. The rungs 152 of the first set 148 are at one of their ends each electrically coupled to the first antenna ring 142, thereby defining a first segment 162, and the rungs 152 of the second set 150 are at one of their ends each electrically coupled to the second antenna ring 144, thereby defining a second segment 164. The rungs 152 of both sets 148, 150 are made of a conductive material and at their free ends, which are not coupled to any of the antenna rings 142, 144, each electrically coupled to the shielding element 146 via a coupling element 156, which is a conductor in this embodiment. Capacitors 158 for 3T Larmor-frequency are placed in the rungs 152 providing a low-pass design. The first and the second set 148, 150 of rungs 152 comprise each a number of sixteen rungs 152. The rungs 152 of the first and the second set 148, 150 are circumferentially displaced with a regular distance between adjacent rungs 152 and alternately arranged in a circumferential direction.

The segments 162, 164 are provided with a length longer than half the length of the RF antenna device 140, so that the rungs 152 of both segments 162, 164 overlap in a center area of the RF antenna device 140. The RF antenna device 140 of this embodiment has a shielding diameter of approximately 68 cm, a coil diameter of approximately 60 cm, and a coil length of approximately 50 cm. The overlap is about 6.4 cm.

The RF antenna device 140 is segmented into two segments 162, 164 in its longitudinal direction 154, also referred to as z-direction. The RF antenna device 140 has a hybrid design, where each segment 162, 164 of the RF antenna device 140 combines features of a transverse electromagnetic (TEM) coil in the center region of the RF antenna device 140 and a birdcage coil at the longitudinal ends thereof. Each segment 162, 164 of the RF antenna device 140 is provided with two activation ports, which are not illustrated in the figures. Accordingly, each segment 162, 164 is operated with two-channels, i.e. each segment 162, 164 provides the features of a common quadrature coil. With e.g. a number of two segments 162, 164, each having two activation ports, a total number of four channels is provided. In this embodiment, a single amplifier and a power splitter, which are not illustrated in the figures, are used to feed the RF antenna device 140. The power splitter is adjustable to split the power freely and with user defined phases to the four activation ports of the two segments 162, 164 of the RF antenna device 140 by the control unit 126. The amplifier and the power splitter are connected to the control unit 126. In an alternative embodiment, independent amplifiers are used for feeding each segment 162, 164 of the RF antenna device 140.

Now will be described a method for operation of the MRI system 110 and the RF antenna device 140 to apply an RF field to the examination space 116. Each segment 162, 164 of the RF antenna device 140 is controlled individually to generate a magnetic field by the control unit 126. Due to the individual control of the segments 162, 164, a common control of the magnetic field in the RF antenna device 140 is performed to provide a homogenous $B_1$ field within the examination space 116. The individual control of the segments 162, 164 is performed by evaluating and adjusting weights of activation for each activation port in each segment. The weights are complex values defining amplitudes and phases for the activation ports, i.e. the weights indicate how the power is split up to the activation ports in amplitude and phase. An absolute level of the $B_1$ field is adapted by control of the power amplifier. Shimming is performed by adjusting the weights. Accordingly, inhomogeneity of the subject of interest 120 in the longitudinal direction 154 of the RF antenna device 140 can directly be addressed.

Figure 3:
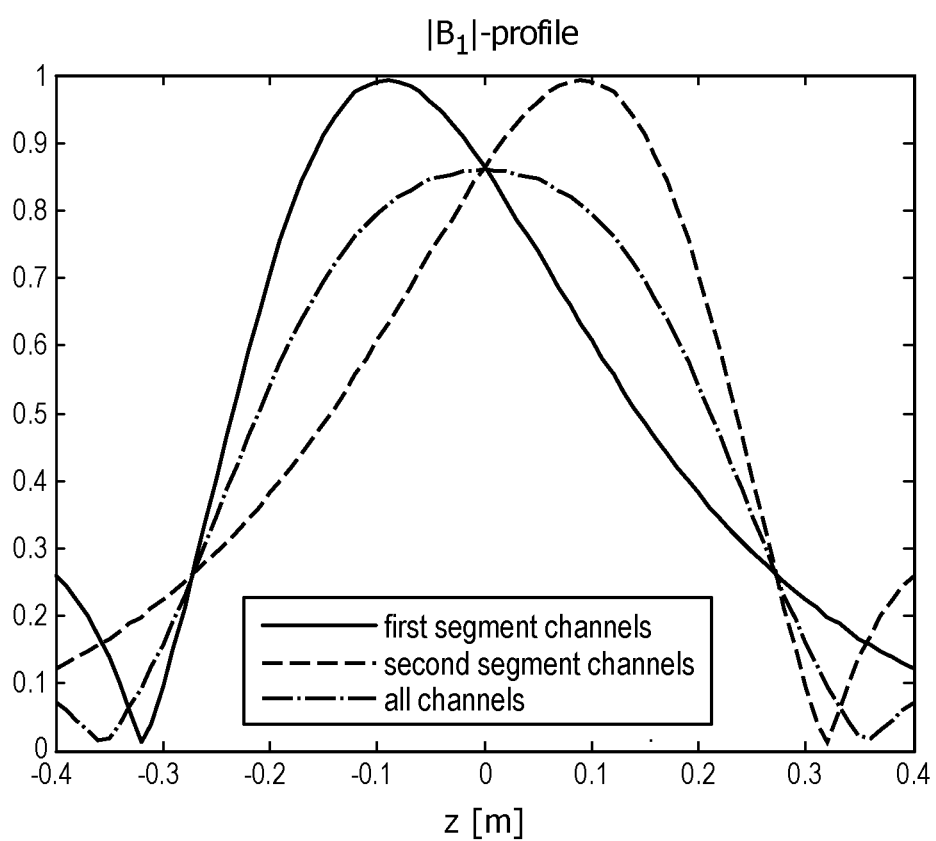
FIG. 3 is a diagram showing a $B_1$ profile along the z-axis the RF antenna device according to a first embodiment.

FIG. 3 shows the magnetic $B_1$ fields of the RF antenna device 140. As can be seen, the two segments 162, 164 generate each a $B_1$ magnetic field, which is slightly shifted out of the center of the axis of the z-direction 154. The combined $B_1$ magnetic field, which is shown decreased by a factor of 2 in FIG. 3 to be compared in shape to the excitations of the individual segments 162, 164, has its maximum at the center of the z-axis. Accordingly, the profile of the $B_1$ magnetic field is similar to that of a conventional body coil.

In a second embodiment, the RF antenna device 140 is a transverse-electromagnetic (TEM) coil. Apart from the different design of the coil, the MRI system 110 using the RF antenna device 140 of the second embodiment is identical to that of the first embodiment. Also the operation of RF antenna device 140 and the MRI system 110 is similar to the operation of those of the first embodiment.

Figure 4:
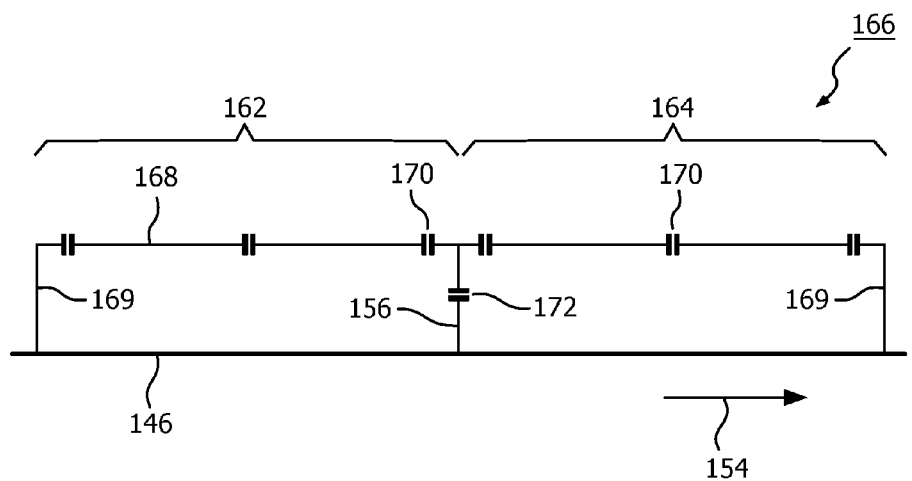
FIG. 4 is a schematic illustration of a TEM coil element of an RF antenna device according to a second embodiment.

FIG. 4 shows a TEM coil element 166 of the RF antenna device 140. A shielding element 146 is provided at an outer circumference of the RF antenna device 140 defining a tubular body of the RF antenna device 140. The shielding element 146 in this embodiment is conductive at the operating frequency, but not at the frequency of the gradient field generated by the magnetic gradient coil system 122. The TEM coil element 166 comprises a strip section 168, which is arranged in parallel to the longitudinal direction 154 of the RF antenna device 140 at an inner side of the shielding element 146. The strip section 168 is at its longitudinal ends coupled via conductor elements 169 to the shielding element 146. The strip section 168 is made of a conductive material, and capacitors 170 are provided within the strip section 168. The TEM coil element 166 in this embodiment is provided with a coupling element 156, which electrically couples the strip section 168 to the shielding element 146. The coupling element 156 is positioned in a center between the conductor elements 169. The coupling element 156 is conductive and comprises a capacitor 172. Accordingly, the TEM coil element 166 and the entire RF antenna device 140 are segmented by the coupling element 156 into two decoupled segments 162, 164. In a different embodiment, another type of coupling element 156 can be used.

Figure 5:
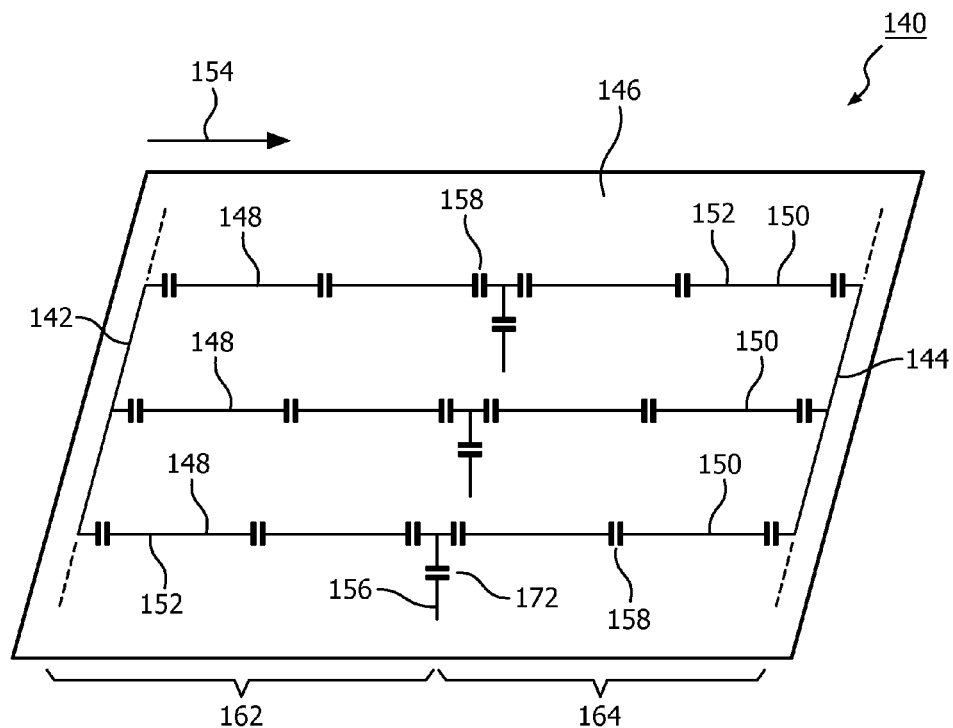
FIG. 5 is a schematic illustration of a RF antenna device according to a third embodiment.

FIG. 5 shows an RF antenna device 140 according to a third embodiment. The RF antenna device 140 of the third embodiment is also a hybrid RF antenna device 140 similar to the RF antenna device 140 of the first embodiment. Therefore, only the differences between the RF antenna devices 140 according to the third embodiment and the first embodiment are described.

The RF antenna device 140 according to the third embodiment comprises a first and a second antenna ring 142, 144, which are provided as conductive loops at opposite end faces of the RF antenna device 140. A shielding element 146 is provided at an outer circumference of the RF antenna device 140. FIG. 5 shows an unrolled view of the RF antenna device 140.

A first and second set 148, 150 of rungs 152 are both arranged in parallel to the longitudinal direction 154 of the RF antenna device 140 at an inner side of the shielding element 146. The rungs 152 of the first set 148 are at one of their ends each electrically coupled to the first antenna ring 142, thereby defining a first segment 162, and the rungs 152 of the second set 150 are at one of their ends each electrically coupled to the second antenna ring 144, thereby defining a second segment 164. The rungs 152 of both sets 148, 150 are made of a conductive material and comprise capacitors, whereby the rungs are at their other, free ends electrically coupled to each other in pairs. Furthermore, the rungs 152 of both sets 148, 150 are at these free ends electrically coupled to the shielding element 146 via a coupling element 156, which is a conductor in this embodiment. Capacitors 158 are placed in the rungs 152 providing a low-pass design. Accordingly, the rungs 152 of the first and the second set 148, 150 are arranged on common longitudinal axis in pairs.

The RF antenna device 140 is segmented into two segments 162, 164 in its longitudinal direction 154, which are decoupled. The segments 162, 164 have half the length of the RF antenna device 140.

While the invention has been illustrated and described in detail in the drawings and foregoing description, such illustration and description are to be considered illustrative or exemplary and not restrictive; the invention is not limited to the disclosed embodiments. Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage. Any reference signs in the claims should not be construed as limiting the scope.

REFERENCE SYMBOL LIST 110 magnetic resonance (MR) imaging system
112 magnetic resonance (MR) scanner 114 main magnet
116 RF examination space
118 center axis
120 subject of interest
122 magnetic gradient coil system
124 RF screen
126 MR imaging system control unit
128 monitor unit
130 MR image reconstruction unit
132 control line
134 RF transmitter unit
136 RF switching unit
138 control line
140 radio frequency (RF) antenna device
142 first antenna ring, first conductive loop
144 second antenna ring, second conductive loop
146 shielding element
148 first set of rungs
150 second set of rungs
152 rung
154 longitudinal direction, longitudinal axis
156 coupling element, conductor
158 capacitor
162 first segment
164 second segment
166 TEM coil element
168 strip section
169 conductor element
170 capacitor
172 capacitor

The invention claimed is:

1. A radio frequency antenna device for applying an RF field to an examination space of a magnetic resonance (MR) imaging system, the antenna device comprising:
 a tubular body,
 a first and a second antenna ring, which are spaced apart on a common rotational axis,
 a shielding element provided at an outer circumference of the RF antenna device, the first and second annular ring being disposed inside the shielding element, and
 a first and second set of rungs, which are both arranged in parallel to the common rotational axis at an inner side of the shielding element, wherein:
 the RF antenna device is segmented in its longitudinal direction,
 each segment is provided with at least one activation port,
 each rung of the first set of the rungs is each electrically coupled to the first antenna ring at one end, thereby defining a first segment,
 each rung of the second set of the rungs is electrically coupled to the second antenna ring at one end, thereby defining a second segment,
 the rungs of both the first and second segments have free ends opposite the one ends, the free ends are not coupled to any of the antenna rings, and
 each free end is electrically coupled to the shielding element via a coupling element.

2. The RF antenna device of claim 1, wherein
 the first and the second sets of rungs comprise the same number of rungs, and
 the rungs of the first and the second sets are alternately arranged in a circumferential direction.

3. The RF antenna device of claim 2, wherein
 each segment is provided with a length longer than half a length of the RF antenna device, so that the rungs of both segments overlap in a center area of the RF antenna device.

4. The RF antenna device of claim 3, wherein the overlap is about 6.4 cm.

5. The RF antenna device of claim 1, further comprising:
 at least one set of intermediate rungs arranged in parallel to the longitudinal direction of the RF antenna device at an inner side of the shielding element, thereby defining at least one an intermediate segment located between the first and second segments,
 wherein
 the intermediate rungs are at adjacent ends electrically coupled to each other in pairs, and electrically coupled to the shielding element via a coupling element.

6. An RF antenna comprising:
 a tubular RF shield having a longitudinal axis;
 first and second antenna rings disposed inside and displaced from the tubular RF shield, the first and second antenna rings being disposed transverse to the longitudinal axis;
 a set of first rungs, first ends of the first rungs being connected to the first antenna ring, the first rungs extending parallel to the longitudinal axis;
 a set of second rungs, second ends of the second rungs being connected to the second antenna ring, the second rungs extending parallel to the longitudinal axis;
 wherein a second end of each first rung is capacitively coupled to a second end of one of the second rungs and capacitively coupled to the tubular RF shield.

7. A magnetic resonance imaging system, comprising
 a main magnet for generating a static magnetic field,
 a magnetic gradient coil system for generating gradient magnetic fields superimposed to the static magnetic field,
 an examination space provided to position a subject of interest within,
 at least one radio frequency antenna device for applying an RF field to the examination space to excite nuclei of the subject of interest, the at least one radio frequency antenna device including: a tubular body, a first and a second antenna ring, which are spaced apart on a common rotational axis, a shielding element provided at an outer circumference of the RF antenna device, the first and second annular ring being disposed inside the shielding element, and a first and second set of rungs, which are both arranged in parallel to the common rotational axis at an inner side of the shielding element, wherein: the RF antenna device is segmented in its longitudinal direction, each segment is provided with at least one activation port, each rung of the first set of the rungs is each electrically coupled to the first antenna ring at one end, thereby defining a first segment, each rung of the second set of the rungs is electrically coupled to the second antenna ring at one end, thereby defining a second segment, the rungs of both the first and second segments have free ends opposite the one ends, the free ends are not coupled to any of the antenna rings, and each free end is electrically coupled to the shielding element via a coupling element, and
 a control unit connected with the activation ports for individually controlling each segment of the RF antenna device.

8. The magnetic resonance imaging system of claim 7, wherein the first and the second sets of rungs comprise the same number of rungs, and the rungs of the first and the second sets are alternately arranged in a circumferential direction.

9. The magnetic resonance imaging system of claim 8, wherein each segment is provided with a length longer than half a length of the RF antenna device, so that the rungs of both segments overlap in a center area of the RF antenna device.

10. The magnetic resonance imaging system of claim 9, wherein the overlap is about 6.4 cm.

11. The magnetic resonance imaging system of claim 7 further comprising:
at least one set of intermediate rungs arranged in parallel to the longitudinal direction of the RF antenna device at an inner side of the shielding element, thereby defining at least one an intermediate segment located between the first and second segments, wherein the intermediate rungs are at adjacent ends electrically coupled to each other in pairs, and electrically coupled to the shielding element via a coupling element.

12. A method for applying a radio frequency field to an examination space of a magnetic resonance imaging system, comprising:
providing a magnetic resonance imaging system that includes: a main magnet for generating a static magnetic field, a magnetic gradient coil system for generating gradient magnetic fields superimposed to the static magnetic field, an examination space provided to position a subject of interest within, at least one radio frequency antenna device for applying an RF field to the examination space to excite nuclei of the subject of interest, the at least one radio frequency antenna device including: a tubular body, a first and a second antenna ring, which are spaced apart on a common rotational axis, a shielding element provided at an outer circumference of the RF antenna device, the first and second annular ring being disposed inside the shielding element, and a first and second set of rungs, which are both arranged in parallel to the common rotational axis at an inner side of the shielding element, wherein: the RF antenna device is segmented in its longitudinal direction, each segment is provided with at least one activation port, each rung of the first set of the rungs is each electrically coupled to the first antenna ring at one end, thereby defining a first segment, each rung of the second set of the rungs is electrically coupled to the second antenna ring at one end, thereby defining a second segment, the rungs of both the first and second segments have free ends opposite the one ends, the free ends are not coupled to any of the antenna rings, and each free end is electrically coupled to the shielding element via a coupling element, and a control unit connected with the activation ports for individually controlling each segment of the RF antenna device,
individually controlling each activation port in each segment of the RF antenna device to generate a magnetic field, and
commonly controlling the activation ports in each segment of the RF antenna device to provide a homogenous $B_1$ field within the examination space.

13. The method of claim 12, wherein
the step of individually controlling each activation port in each segment of the RF antenna device to generate a magnetic field comprises adjusting weights of the activation ports of each segment, and
the step of commonly controlling the activation ports in each segment of the RF antenna device to provide the homogenous $B_1$ field comprises adjusting the activation according to the weights.

14. A non-transitory computer-readable medium carrying computer code configured to control a magnetic resonance imaging system to perform the method according to claim 12.

15. A radio frequency antenna for a magnetic resonance (MR) imaging system, the antenna comprising:
a tubular RF shield encircling a longitudinal axis;
a first antenna ring disposed inside the tubular RF shield displaced inward from the tubular RF shield and transverse to the longitudinal axis;
a second antenna ring disposed parallel to the first antenna ring inside the tubular RF shield displaced inward from the tubular RF shield and transverse to the longitudinal axis;
a set of first rungs disposed inside the tubular RF shield extending parallel to the longitudinal axis, each first rung being electrically connected at one end to the first antenna ring and being capacitively coupled at a second end to the tubular RF shield;
a set of second antenna rungs, the second rungs being disposed inside and displaced from the tubular RF shield, each second rung being connected at one end to the second antenna ring and capacitively coupled at a second end to the tubular RF shield;
a first activation port connected with one of the first rungs or the first antenna ring;
a second activation port connected with one of the second rungs or the second antenna ring; and
wherein the first rungs are not electrically connected to the second antenna ring and the second rungs are not electrically connected to the first antenna ring, and wherein the first and second rungs extend parallel to and spaced from each other.

16. The RF antenna of claim 15, wherein the first and second sets of rungs include the same number of rungs and the first and second rungs are alternately arranged in a circumferential direction.

17. The RF antenna of claim 16, wherein the first rungs and the second rungs are longer than half a distance between the antenna rings such that the first and second rungs overlap in a central area.

* * * * *